United States Patent
Kaczman et al.

(10) Patent No.: US 8,010,074 B2
(45) Date of Patent: Aug. 30, 2011

(54) MIXER CIRCUITS FOR SECOND ORDER INTERCEPT POINT CALIBRATION

(75) Inventors: Daniel L. Kaczman, Newbury Park, CA (US); Lawrence E. Connell, Naperville, IL (US); Joseph P. Golat, Cary, IL (US); Manish N. Shah, Arlington Heights, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 714 days.

(21) Appl. No.: 12/028,720

(22) Filed: Feb. 8, 2008

(65) Prior Publication Data
US 2009/0203347 A1    Aug. 13, 2009

(51) Int. Cl.
  H04B 1/10    (2006.01)
  H04B 15/06   (2006.01)
  H04B 1/26    (2006.01)
(52) U.S. Cl. ......... 455/313; 455/296; 455/317; 455/326
(58) Field of Classification Search ............. 455/196, 455/1, 199.1, 283–285, 296, 313–326, 333, 455/63.1; 327/101–103, 119–120, 317
See application file for complete search history.

(56) References Cited

U.S. PATENT DOCUMENTS

| | | | |
|---|---|---|---|
| 6,763,227 B2 * | 7/2004 | Kramer ..................... | 455/115.1 |
| 6,992,519 B2 | 1/2006 | Vilander et al. | |
| 7,197,291 B2 | 3/2007 | Mach et al. | |
| 7,277,682 B2 * | 10/2007 | Zhou ......................... | 455/127.1 |
| 7,421,263 B2 * | 9/2008 | Kim .......................... | 455/234.1 |
| 7,532,874 B2 * | 5/2009 | Muhammad et al. ...... | 455/278.1 |
| 7,554,380 B2 * | 6/2009 | Embabi et al. ............. | 327/356 |
| 7,561,862 B2 * | 7/2009 | Woo-nyun .................. | 455/226.1 |
| 2004/0152435 A1 * | 8/2004 | Pellat et al. ................ | 455/199.1 |
| 2006/0094386 A1 | 5/2006 | Darabi et al. | |
| 2006/0094387 A1 | 5/2006 | Darabi | |
| 2007/0008945 A1 | 1/2007 | Son et al. | |
| 2007/0132500 A1 | 6/2007 | Embabi et al. | |
| 2007/0173220 A1 * | 7/2007 | Kim et al. .................. | 455/296 |
| 2009/0075622 A1 * | 3/2009 | Zhuo et al. ................. | 455/333 |
| 2009/0186587 A1 * | 7/2009 | Sobchak et al. ........... | 455/196.1 |
| 2009/0202022 A1 | 8/2009 | Kaczman et al. | |

OTHER PUBLICATIONS

U.S. Appl. No. 12/018,354, filed Jan. 23, 2008, Sobchak et al.
Walid Y. Ali-Ahmad, "Effective IM2 estimation for two-tone and WCDMA modulated blockers in zero-IF", www.rfdesign.com, Apr. 2004, pp. 32, 34, 36, and 38.
Hotti et al., "Dual-Mode Direct-Conversion RF Receiver with IIP2 Calibration", CSIC Digest, Jul. 2004, pp. 183-186, 0-7803-8616-7/04 20004 IEEE, Helsinki, Finland.
Hotti et al., IIp2 Calibration Methods for Current Output Mixer in Direct-Conversion Receivers, 2005, pp. 5059-5062, 0-7803-8834-8/05 IEEE, Espoo, Finland.

* cited by examiner

*Primary Examiner* — Simon D Nguyen

(57) ABSTRACT

A balanced mixer circuit (300, 400, 500, 600, 700 and 800) in a baseband receiver (202) includes an oscillator circuit (212), a mixer (214 and 215), a digital-to-analog converter (258 and 259) and a digital signal processor (250). The mixer includes CMOS devices (301, 302, 303 and 304). In response to differential outputs from the mixer, the digital signal processor controls the digital-to-analog converter to output bias voltages for the gate of at least one of the CMOS devices of the mixer to compensate for imbalance in the differential output of the mixer that may be caused by mismatch among two or more CMOS devices of the mixer or caused by other reasons, in order to increase second order intercept point of the mixer.

19 Claims, 7 Drawing Sheets

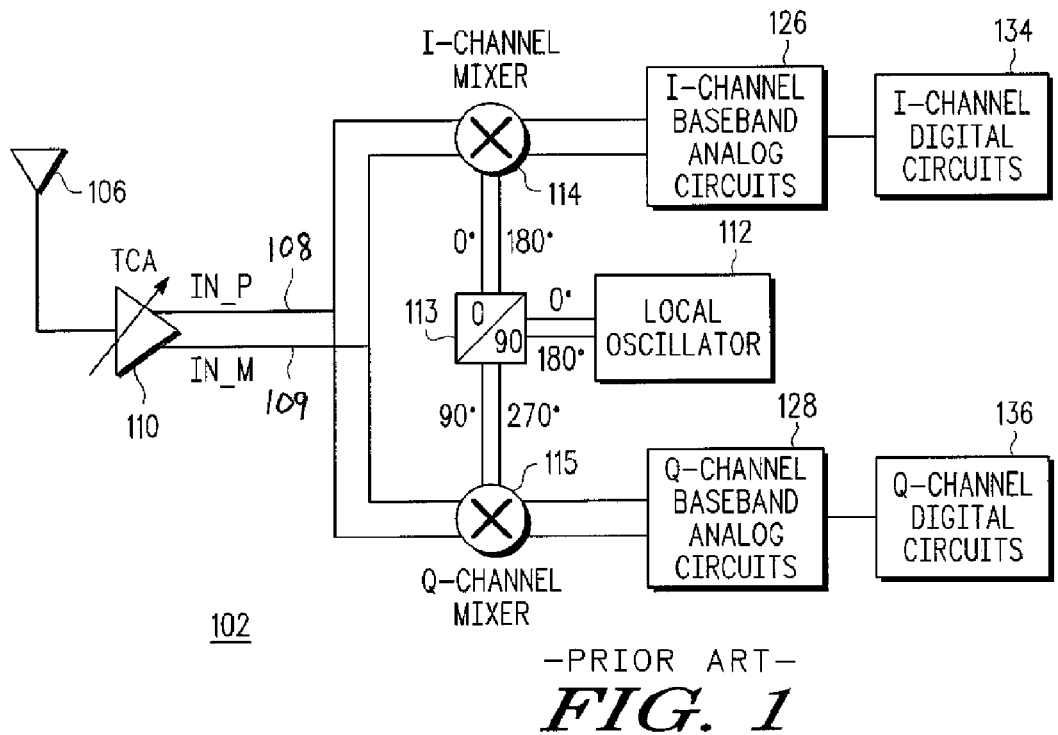
FIG. 1 —PRIOR ART—
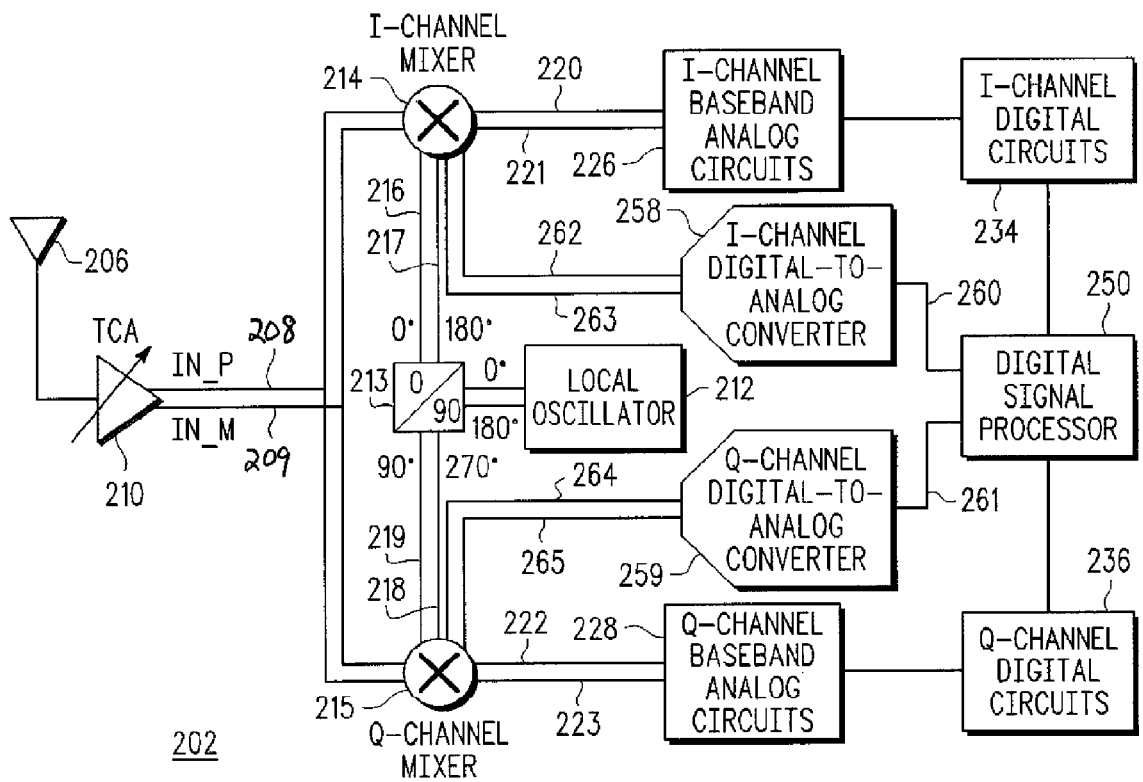
FIG. 2

MIXER CIRCUITS FOR SECOND ORDER INTERCEPT POINT CALIBRATION

BACKGROUND OF THE INVENTION

1. Field of the Invention

This invention relates generally to radio frequency receivers, and more specifically to mixer circuits that reduce second order intermodulation distortion in a direct conversion receiver.

2. Related Art

A receiver uses the frequency response of a low noise amplifier (LNA), a surface acoustic wave (SAW) filter and a duplexer to attenuate signals that are away from a center frequency of the receiver sufficiently enough so that they do not corrupt a desired signal. If the LNA and the SAW filter are removed from the analog line-up of the receiver, problems that can detrimentally affect the performance of the receiver may arise. In a transceiver, which comprises a transmitter and a receiver, one such problem is a signal transmitted by the transmitter leaking into a receive path of the receiver. In a receiver with only a duplexer to isolate the receiver from the transmitter, there is considerably less attenuation at the transmitted frequency. A receiver that lacks an LNA and a SAW filter requires additional and/or tighter constraints on at least some non-idealities in the analog line-up of the receiver. One example of a non-ideality on which a tighter constraint is necessary is the second order intercept point (IP2) of the mixer. Without a sufficiently high IP2 of the mixer, the presence of second order intermodulation distortion (IMD2) substantially reduces the sensitivity of the receiver.

Most cellular wireless transceivers use a direct-conversion receiver because a high level of integration can be obtained. However, a direct-conversion receiver requires a high input-related second order intercept point (IIP2), which is the theoretical input level at which the power of the IMD2 products are equal in power to the power of a desired signal. FIG. 1 is a simplified functional block diagram of a portion of a typical known direct-conversion receiver 102. The receiver 102 includes an antenna 106 coupled to a transconductance amplifier (TCA) 110. The TCA 110 is coupled to mixers 114 and 115. The signal path between the TCA 102 and the mixers 114 and 115 comprises two differential signal paths. An output from the TCA 110 includes differential signals IN_P 108 and IN_M 109, which are both inputted into each I-channel mixer 114 and Q-channel mixer 115. The receiver 102 also includes a local oscillator (LO) 112. One of the pair of outputs of the oscillator 112 is phase shifted by 90° by phase shifter 113 so that the mixers 114 and 115 can provide an I-phase component and a Q-phase component of the received signal. The respective outputs from the oscillator 112 are fed into the I-channel mixer 114 and the Q-channel mixer 115. The mixers 114 and 115 are employed to convert an RF signal to a zero-IF signal. The outputs from the mixers 114 and 115 are fed into I-channel baseband circuits 126 and Q-channel baseband circuits 128, respectively. The signal path for the I-channel comprises two differential signal paths, one path for differential signal I+ and one path for differential signal I−. Ideally, the differential signals should be matched, i.e., their difference should be zero. The greater a mismatch between differential signals I+ and I−, the lower becomes the IIP2 for the I-channel. Analogously, the signal path for the Q-channel comprises two differential signal paths, one path for differential signal Q+ and one path for differential signal Q−. The greater a mismatch between differential signals Q+ and Q−, the lower becomes the IIP2 for the Q-channel. The outputs from the I-channel baseband circuits 126 and the Q-channel baseband circuits 128 are fed into I-channel digital circuits 134 and Q-channel digital circuits 136, respectively. Without a sufficiently high IIP2, the IMD2 can reduce the sensitivity of the receiver 102.

Second-order intermodulation distortion products are generated when a non-ideal receiver is exposed to a two-tone continuous wave signal or to an amplitude modulated signal. In the case where interfering signals are large, very high IIP2 performance can be required to minimize signal-to-noise ratio (SNR) degradation. Non-idealities that affect IIP2 performance include device mismatch and layout asymmetry. Manufacturing process changes can also cause IIP2 performance to vary from part-to-part. Even for a particular part, IIP2 performance can vary significantly as temperature changes and with interferer frequency offset. For each part, IIP2 performance can vary with interferer offset and modulation bandwidth. To achieve consistently high IIP2 performance over many parts, calibration techniques can be employed. However known calibration techniques do not address temperature variation, can create significant DC offsets in the receiver path, can result in long calibration times that complicate system design, can degrade the noise figure, can degrade common-mode rejection ratio (CMRR) of a baseband operational amplifier (a reduction in the CMRR can significantly limit IIP2 calibration range), can be difficult or non-optimal to implement from a layout perspective, and can result in limited/inadequate calibration range.

One known approach performs IIP2 calibration at the mixers using trimmed resistors and capacitors and is limited by calibration range determined by the minimum size capacitors and resistors. This approach induces significant DC offsets. Such an approach does not address the problem of IIP2 compensation over temperature. Such an approach is based on the bipolar Gilbert cell mixer topology. The Gilbert cell mixer topology has degraded linearity performance compared to an optimized complementary metal oxide semiconductor (CMOS) topology.

Two other known approaches are based on the Gilbert cell mixer topology driving a current input load. The Gilbert cell mixer topology limits optimum achievable IIP2 performance as compared to a passive CMOS mixer and the manufacturing process cost is higher. A first approach performs IIP2 calibration before the mixers by introducing current offset at the radio frequency TCA stage. This induces significant DC offset into the receiver lineup. A second approach alters current offset in the differential oscillator buffer legs by injecting a correction current at the oscillator. This alters the duty cycle of the oscillator signal. The second approach does not work with a double-balanced mixer topology. The second approach only works for single-balanced mixer topology because the induced offset applied to the mixers is averaged out. The second approach is not applicable to rail-to-rail CMOS oscillator implementations, does not provide a rail to rail input to the mixer for optimum linearity, and does not provide common mode.

Another known approach applies correction to the bulk of the mixer devices. Some known mixers do not allow for a common-centroid layout while still maintaining each device of the mixer on a same bulk. Lack of a common-centroid layout results in degraded matching and increased IIP2. When a common-centroid layout can only be accomplished by disposing each device on a separate bulk, matching degrades because the separation between devices is greater. A high DC offset is disadvantageously created if the common mode voltage offset is induced at the mixer input, such as at the source of mixer devices. A resistor at the input adds noise to the lineup because an additional connection is unnecessarily made to the signal path. If the common mode voltage offset is forced, through a resistor, at the mixer output, a high DC offset is disadvantageously created. The resistor at the output adds noise to the lineup. Each time a calibration is done a DC offset correction may be needed, which increases calibration time. A known IIP2 optimization method merely seeks an acceptable performance, and makes no attempt to achieve best performance with minimal calibration time.

Still another known IIP2 optimization technique is performed after the mixer. With such a post-mixer technique, unbalanced differential signals that are outputted from the mixer are balanced using a post-mixer IIP2 calibration D/A converter. However, the DC offset becomes large at extreme settings of the post-mixer IIP2 calibration, which requires a large number of bits for IIP2 calibration D/A converter, and the technique disadvantageously requires that a DC offset correction algorithm be run after each IIP2 calibration. The CMRR degrades at extreme settings of the post-mixer IIP2 calibration D/A converter.

Some mixers have a voltage-mode stage following the mixer, which is non-optimal for linearity.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 1 is a simplified functional block diagram of a portion of a typical known direct-conversion receiver that includes passive mixers;

FIG. 2 is a simplified functional block diagram of a portion of a direct-conversion receiver that includes mixers in accordance with the invention;

DETAILED DESCRIPTION OF THE EXEMPLARY EMBODIMENT

Figure 3:
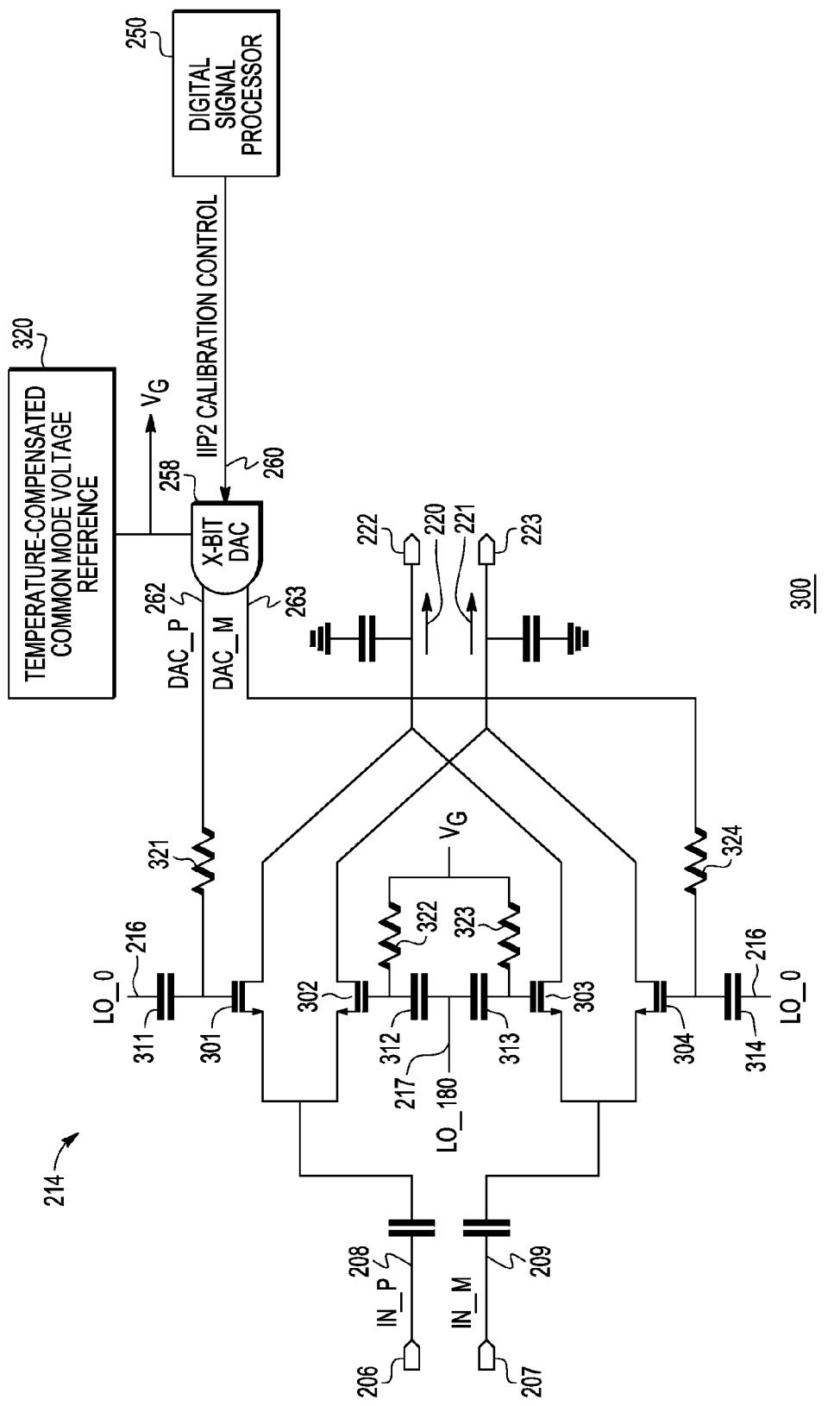
FIG. 3 is a schematic for a circuit of a first embodiment of the mixers of FIG. 2.

FIG. 2 is a simplified functional block diagram of a portion of a direct-conversion receiver 202 in accordance with the invention. The receiver 202 includes an antenna 206 coupled top a transconductance amplifier (TCA) 210. The TCA 210 is coupled to mixer 214 and to mixer 215. The signal path between the TCA 210 and the mixers 214 and 215 comprises two differential signal paths. An output from the TCA 210 includes differential signals IN_P 208 and IN_M 209, which are both inputted into each I-channel mixer 214 and Q-channel mixer 215. The receiver 202 also includes a local oscillator (LO) 212. The signals, Lo_0 and Lo_180, from the oscillator 212 are coupled directly to mixer 214. One of the pair of outputs from the oscillator 212 is phase shifted by 90° by phase shifter 213 so that the mixers 214 and 215 can provides an I-phase component and a Q-phase component of the received signal. The signals Lo_90 and Lo_270 from the phase shifter 213 are coupled to mixer 215. The mixers 214 and 215 are employed to convert an RF signal to a zero-IF signal. Mixer 214 has differential outputs output currents 220 and 221 that are fed into I-channel baseband circuits 226. Mixer 215 has differential outputs 222 and 223 that are fed into Q-channel baseband circuits 228. The signal path for the I-channel comprises two differential signal paths, one path for differential signal I+ and one path for differential signal I−. Ideally, the differential signals should be matched, i.e., their difference should be zero. The greater a mismatch between differential signals I+ and I−, the greater becomes the IIP2 for the I-channel. Analogously, the signal path for the Q-channel comprises two differential signal paths, one path for differential signal Q+ and one path for differential signal Q−. The greater a mismatch between differential signals Q+ and Q−, the greater becomes the IIP2 for the Q-channel. A digital output from the I-channel baseband circuits 226 is fed into I-channel digital circuits 234. The digital output from the Q-channel baseband circuits 228 is fed into Q-channel digital circuits 236. An output signal from the I-channel digital circuit 234 and an output signal from the Q-channel digital circuit 236 are fed into a digital signal processor (DSP) 250. The DSP 250 performs operations to determine an optimal IIP2 setting for the mixers 214 and 215 in order to reduce IMD2 in the receiver 202. The operations performed by the DSP 250 are described in U.S. patent application publication No. US2009/0186587 A1, filed Jan. 23, 2008, by Sobchak et al., entitled TUNING A SECOND ORDER INTERCEPT POINT OF A MIXER IN A RECEIVER, and assigned to the assignee of the present application, which is hereby fully incorporated by reference herein. The DSP 250 outputs digital signals indicative of an optimal IIP2 setting for each of the mixers 214 and 215. The DSP 250 outputs an x-bit digital signal 260 for the I-channel and an x-bit digital signal 261 for the Q-channel. Each x-bit digital signal 260 and 261 from the DSP 250 is fed into a respective x-bit IP2 control digital-to-analog converter (DAC) 258 and 259. The IP2 control DAC 258 outputs an analog differential signal pair 262 and 263 that is coupled to mixer 214 to control an operating parameter thereof. The IP2 control DAC 259 outputs an analog differential signal pair 264 and 265 that is coupled to mixer 215 to control an operating parameter thereof.

A balanced passive mixer comprises two transistors. In exemplary embodiments, the mixer 214 and 215 is a double-balanced passive mixer comprising four transistors. The value of the analog output signal (hereinafter "DAC setting") from each IP2 control DAC 258 and 259 controls the operation of the respective mixer 214 and 215 by changing the DC bias at the gate of at least one transistor of the respective mixer, which, in turn, affects the IIP2 of the respective mixer. More specifically, when differential signals I+ and I− at the output nodes 222 and 223 of the I-channel mixer 214 are not matched, the receiver 202 introduces, in steps, a DC voltage as a bias at the gate of two transistors of the mixer 214, to cause I+ and I− to become more closely matched. When differential signals Q+ and Q− at the output of the Q-channel mixer 215 are not matched, the receiver 202 introduces, in steps, a DC voltage as a bias at the gate of two transistors of the mixer 215, to cause Q+ and Q− to become more closely matched.

The receiver 202 may include other components and circuits that are not shown in the drawings, including an automatic gain control (AGC) circuit, a coarse DC offset correction (DCOC) circuit, and a fine DCOC circuit.

Referring now to FIGS. 3-8, various embodiments of the mixers 214 and 215 are illustrated by circuits 300, 400, 500, 600, 700 and 800. The oscillator 212 feeds a LO_0 signal and a LO__180 signal to inputs 216 and 217 of the I-channel mixer 214. The phase shifter 213 feeds a LO__90 signal and a LO__270 signal to corresponding inputs 218 and 219 of the Q-channel mixer 215. The oscillator signals are named generically to accommodate 25% duty-cycle schemes. In all other regards, the circuit 300, 400, 500, 600, 700 and 800 for each embodiment of mixer 214 is substantially similar to the circuit for each embodiment of mixer 215; therefore, only the circuit for each embodiment of mixer 214 will be described in detail hereinafter.

FIG. 3 is a schematic of a circuit 300 for a first embodiment of the mixer 214. The circuit 300 illustrates a passive double balanced mixer comprising devices 301, 302, 303 and 304. The term "device" as used in this context means an active amplifying or switching device such as a transistor. In exemplary embodiments, the transistor is a CMOS transistor that includes gate, source and drain terminals. The term "passive" as used in this context, means that the mixer performs no amplification.

The circuit 300 includes an IN_P input node 206 and an IN_M input node 207 for receiving differential input signals IN_P 208 and IN_M 209, respectively, and two output nodes 220 and 221 for outputting differential output currents. The circuit also includes two balanced differential pairs. A first balanced differential pair includes first device 301 and second device 302 that have their sources coupled to the IN_P input node 206 and their drains coupled to opposite output nodes. The drain of first device 301 is coupled to output node 222. The drain of second device 302 is coupled to output node 223. The first device 301 has a gate at which the LO_0 signal is injected. The second device 302 has a gate at which the LO_180 signal is injected. The gate of the second device 302 is coupled to an uncompensated common-mode voltage source for bias. The second balanced differential pair includes third device 303 and fourth device 304 that have their sources coupled to the IN_M input node 207 and their drains coupled to opposite output nodes. The drain of third device 303 is coupled to output node 222. The drain of fourth device 304 is coupled to output node 223. The third device 303 has a gate at which the LO_180 signal is injected. The gate of the third device 303 is coupled to the uncompensated common-mode voltage source for bias. The fourth device 304 has a gate at which the LO_0 signal is injected.

In FIG. 3, the bias voltage at the gates of p-channel CMOS devices 301 and 304 is compensated to correct for IIP2 imbalance, as determined by the DSP 250. In FIG. 3, the bias voltage at the gates of devices 302 and 303 is uncompensated for IIP2 imbalance. The IP2 control DAC 258 is coupled to a temperature-compensated common mode voltage reference 320 that supplies a bias voltage $V_G$ at the gates of the uncompensated devices 302 and 303. This results in less IIP2 variation over temperature. In one embodiment, the value of $V_G$ is 0.8V. A stored digital calibration word is sent from the DSP 250 to the IP2 control DAC 258, and the IP2 control DAC generates compensating differential voltage outputs, DAC_P and DAC_M, therefrom for IIP2 calibration. The value of DAC_P is the value of the common-mode voltage plus the value of an IIP2 correction voltage. The value of DAC_M is the value of the common-mode voltage minus the value of an IIP2 correction voltage. The positive differential output (DAC_P) of the IP2 control DAC 258 is introduced at the gate of device 301, where the LO_0 signal is injected. The negative differential output (DAC_M) of the IP2 control DAC is introduced at the gate of device 304, where the LO_0 signal is injected. The introductions of the compensating differential voltage outputs, DAC_P and DAC_M, as bias at the gates of devices 301 and 304, respectively, correct for IIP2 imbalances.

The circuit 300 includes capacitors 311, 312, 313 and 314 that are used to separate the bias voltages. The gates of devices 301 and 304 are separated from DC by capacitors 311 and 314. The LO_180 node 217 is split with capacitors 312 and 313 also to enhance matching for circuit 300.

In one embodiment, the x-bit IP2 control DAC 258 and 259 is a 6-bit IP2 control DAC having a voltage range for the analog IIP2 correction voltage from each IP2 control DAC of approximately ±12.8 mV. In other words, the total range of the IIP2 correction voltage is approximately 25.6 mV.

In general, the total number of steps is equal to $2^x-1$, where x is the bit size of the IP2 control DAC. Therefore, the total number of steps for the 6-bit IP2 control DAC is sixty-three (63).

In general, a step size is the total range divided by the total number of steps. Therefore, the 6-bit IP2 control DAC has a step size of approximately 406.34 µV=25.6 mV/63.

For any step, the value of the IIP2 correction voltage is equal to ± the step number multiplied by the total range of the output voltage from the IP2 control DAC, divided by the total number of steps.

In circuit 300, the bias voltage at the gates of devices 301 and 304 is the sum of the common-mode voltage and the IIP2 correction voltage, where the IIP2 correction voltage may be a positive or a negative voltage. The bias voltage of the gates of devices 302 and 304 is uncompensated and remains fixed at the common-mode voltage. For example, if the DSP 250 determines that the DAC setting is "0", which is at one extreme of the range of DAC settings, the bias voltage at the gates of device 301 is at a minimum value, which is 0.8V minus thirty-two times 406.34 µV, which equals 0.7874V. As another example, if the DSP 250 determines that the DAC setting is "63", which is at another extreme of the range of DAC settings, the bias voltage at the gates of device 301 is at a maximum, which is 0.8V plus thirty-two times 406.34 µV, which equals 0.8126V.

The circuit 300 includes resistors 321 and 324 that are in parallel with the gate of device 301 and the gate of device 304, respectively. The resistors 321 and 324 act as a shunt, and do not increase noise. The introduction of the IIP2 correction voltages, DAC_P and DAC_M, produces a negligible DC offset (3.5 mV), does not degrade post-mixer CMRR, and overcomes IIP2 calibration limitations of known approaches.

Figure 4:
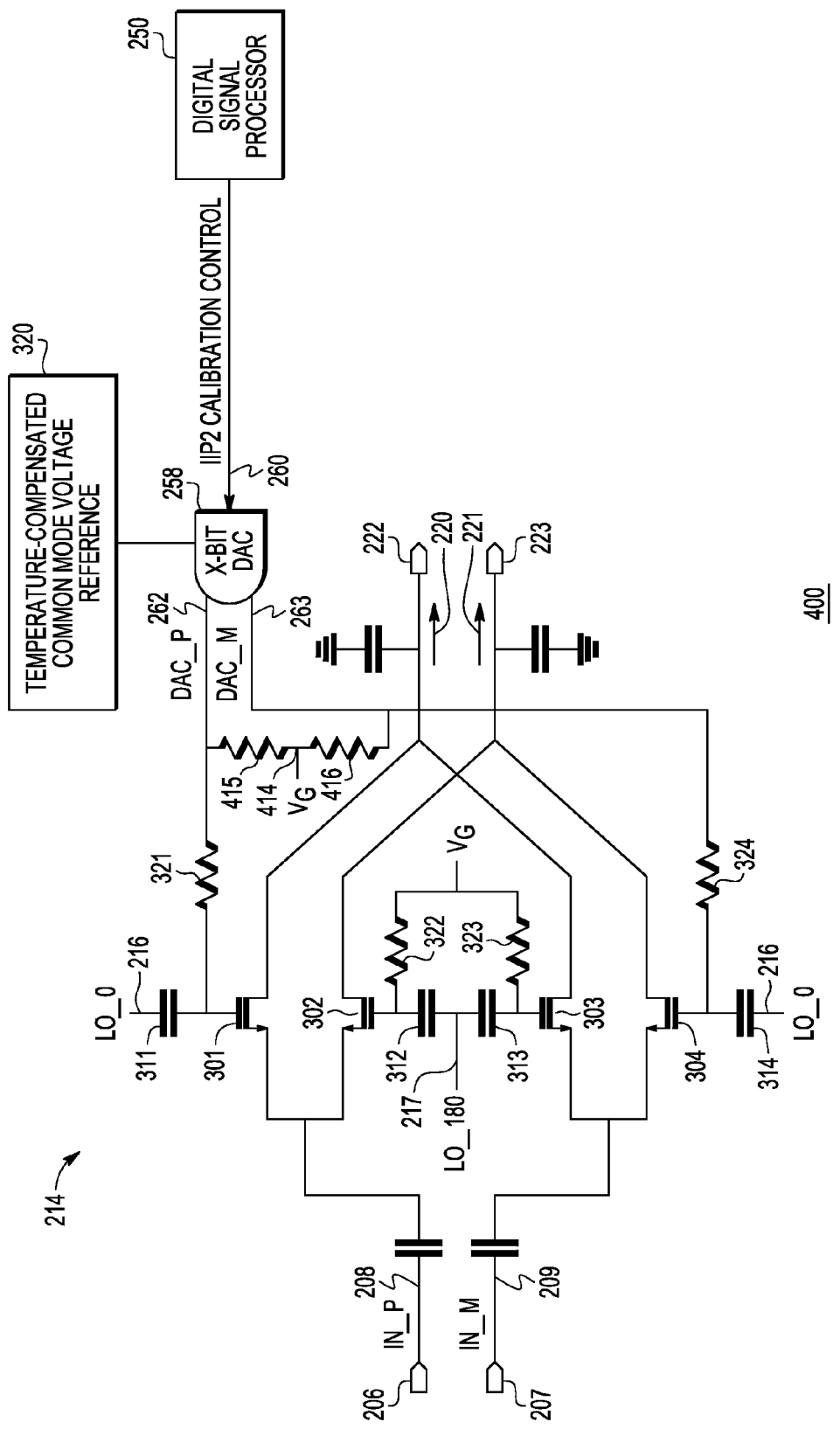
FIG. 4 is a schematic for a circuit of a second embodiment of the mixers of FIG. 2.

FIG. 4 is a schematic for a circuit 400 of a second embodiment of the mixer 214. The circuit 400 illustrates a passive double balanced mixer comprising devices 301, 302, 303 and 304, wherein the IIP2 correction is introduced at the gate of device 301 and the gate of device 304, where the LO__0 signal and the LO__90 signal are injected. The circuit 400 includes a center tap 414 of resistors 415 and 416 across the output of the IP2 control DAC 258, which is used to provide the common-mode voltage that is applied to the gate of the devices 302 and 303 where the LO__180 signal is injected. Generating the gate bias voltage $V_G$ in this fashion tends to eliminate any common-mode offset caused by the IP2 control DAC 258. Advantageously, there is no temperature delta for the IP2 control DAC 258 because as R moves, I moves, and V stays the same.

In circuit 400, the bias voltage at the gates of devices 301 and 304 is the common-mode voltage plus the value of the IIP2 correction voltage, where the IIP2 correction voltage may be a positive or a negative voltage. The bias voltage $V_G$ of the gates of devices 302 and 304 is uncompensated and remains fixed at the common-mode voltage.

Figure 5:
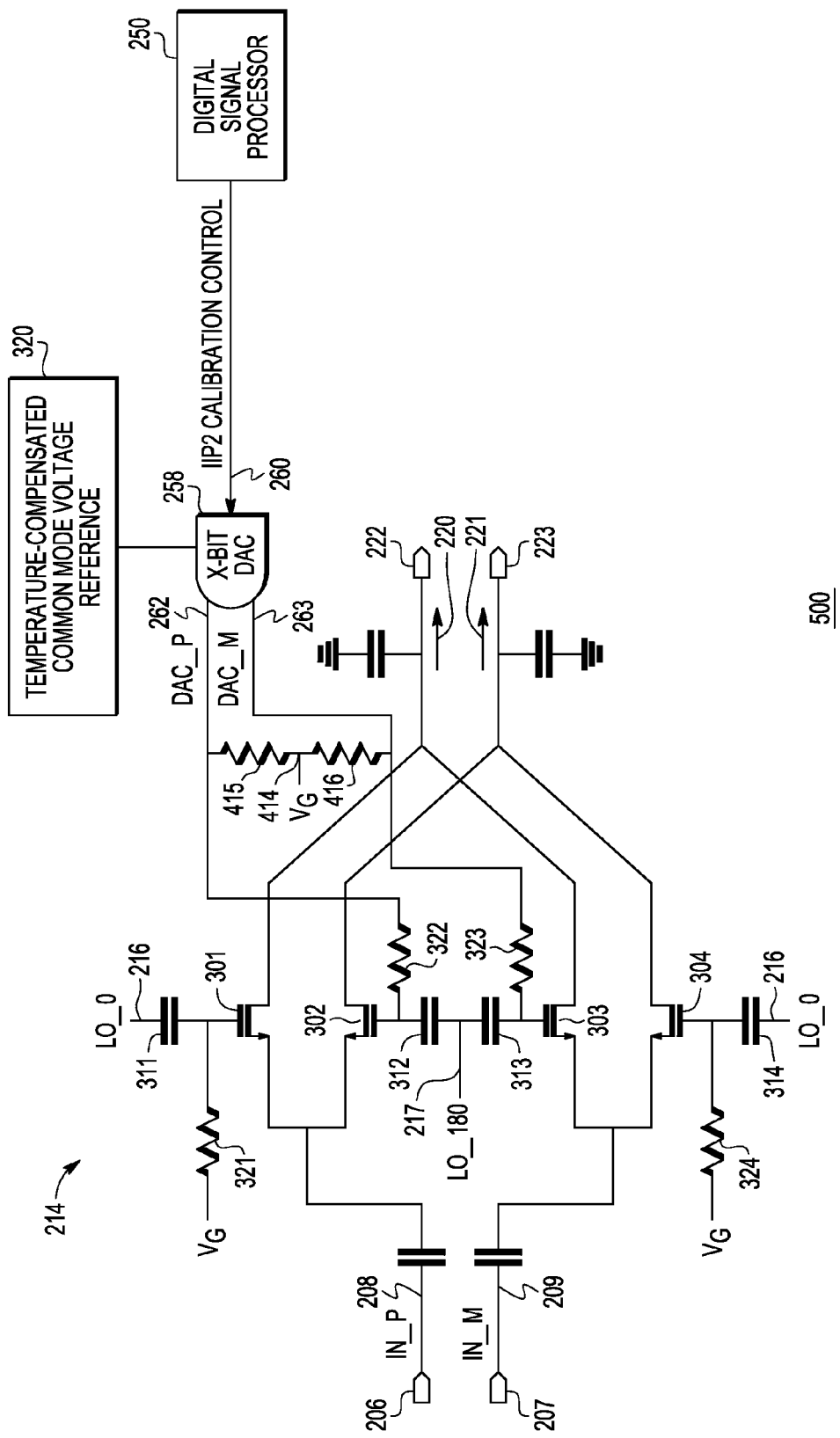
FIG. 5 is a schematic for a circuit of a third embodiment of the mixers of FIG. 2.

FIG. 5 is a schematic for a circuit 500 of a third embodiment of the mixer 214. The circuit 500 illustrates a passive double balanced mixer comprising devices 301, 302, 303 and 304, wherein the IIP2 correction is introduced at the gate of device 302 and at the gate of device 303, where the LO__180 signal is injected. In FIG. 5, the bias voltage at the gates of devices 302 and 303 are compensated to correct for IIP2 imbalance, as determined by the DSP 250. In FIG. 5, the bias voltage at the gates of devices 301 and 304 are uncompensated. The circuit 500 includes a center tap 414 of resistors 415 and 416 across the output of the IP2 control DAC 258, which is used to provide the bias voltage $V_G$ at the gate of the devices 301 and 304 where the LO__0 signal is injected. Alternatively, the circuit 500 does not include the center tap 414 of resistors 415 and 416 across the output of the IP2 control DAC 258, and, instead, uses the approach used in circuit 300 for providing the bias voltage $V_G$ at the gate of device 301 and for the gate of device 304.

In circuit 500, the bias voltage at the gates of devices 302 and 303 is the common-mode voltage plus the value of the IIP2 correction voltage, where the IIP2 correction voltage may be a positive or a negative voltage. The bias voltage of the gates of devices 302 and 304 is uncompensated and remains fixed at the common-mode voltage.

In circuits 300, 400 and 500, the correction is applied symmetrically to the mixer 214 by virtue of the fact that the correction is applied to devices 301 and 304.

Figure 6:
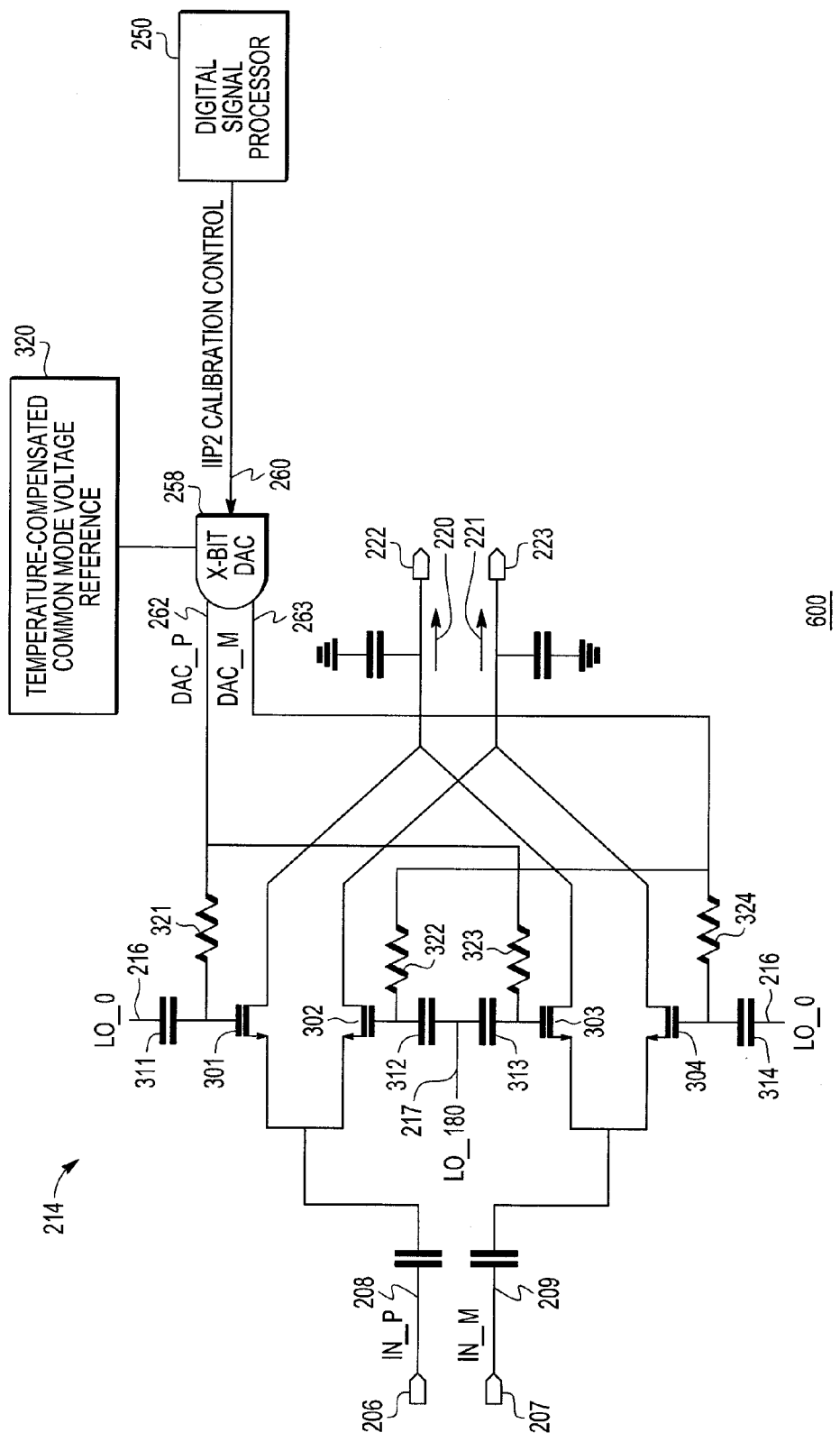
FIG. 6 is a schematic for a circuit of a fourth embodiment of the mixers of FIG. 2.

FIG. 6 is a schematic for a circuit 600 of a fourth embodiment of the mixer 214. The circuit 600 illustrates a passive double balanced mixer comprising devices 301, 302, 303 and 304. In FIG. 6, the bias voltage at the gates of devices 301, 302, 303 and 304 are compensated to correct for IIP2 imbalance, as determined by the DSP 250. The differential output DAC_P is applied at the gate of device 301 and to the gate of device 303. The differential output DAC_M is applied at the gate of device 304 and to the gate of device 302. Unlike in circuits 300, 400 and 500, in circuit 600, the correction is applied to all four devices 301, 302, 303 and 304 of the mixer 214. Circuit 600 achieves double the offset (higher total range) as compared to the other embodiments. In circuit 600, each step size is the LSB of the IP2 correction DAC multiplied by four. In the circuits of the other embodiments of the mixer 214 and 215, each step size is the LSB of the IP2 correction DAC multiplied by two. Circuit 600 requires a greater number of steps than the other embodiments in order for each step in circuit 600 to have the same size as the step size in circuits 300, 400, 500, 700 and 800.

Figure 7:
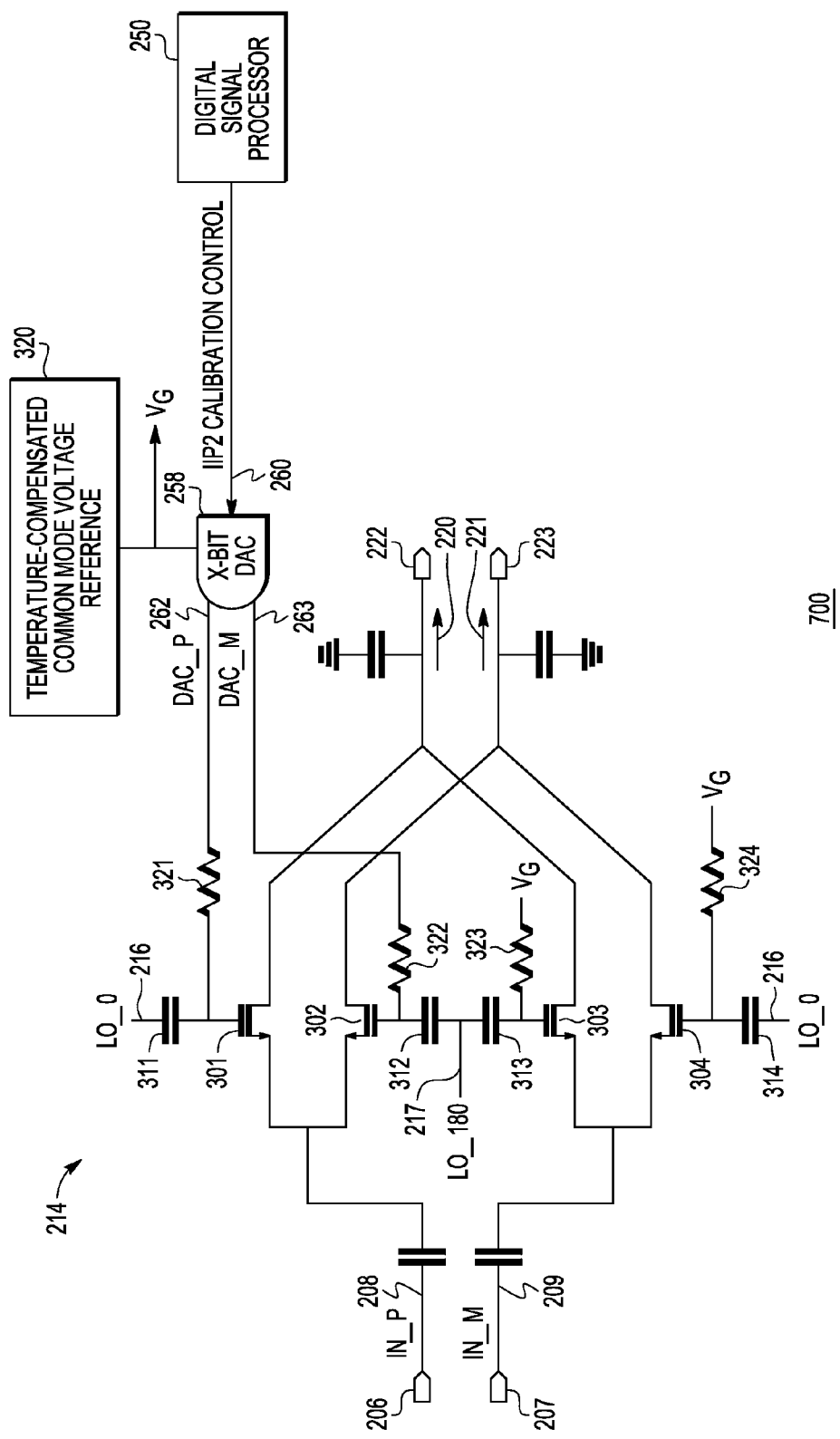
FIG. 7 is a schematic for a circuit of a fifth embodiment of the mixers of FIG. 2.

FIG. 7 is a schematic for a circuit 700 of a fifth embodiment of the mixer 214. The circuit 700 illustrates a passive double balanced mixer comprising devices 301, 302, 303 and 304, wherein the differential output DAC_P from the IP2 control DAC 258 is applied at the gate of device 301 and the differential output DAC_M is applied at the gate of device 302. In FIG. 7, the bias voltage $V_G$ at the gates of devices 301 and 302 are compensated to correct for IIP2 imbalance, as determined by the DSP 250. In FIG. 7, the bias voltage at the gates of devices 302 and 304 are uncompensated. The gate of device 303 and the gate of device 304 are coupled to the common-mode voltage. Alternatively, the circuit 700 includes a center tap 414 of resistors 415 and 416 across the output of the IP2 control DAC 258, and uses the approach used in circuit 400, for providing the bias voltage $V_G$ for the gate of device 303 and for the gate of device 304. Unlike in circuits 300, 400 and 500, in circuit 700, the correction is applied to the mixer 214 asymmetrically by virtue of the fact that the correction is applied to devices 301 and 302. Alternatively, the correction is applied to the mixer 214 asymmetrically by applying the correction to devices 303 and 304, instead of to devices 301 and 302.

Figure 8:
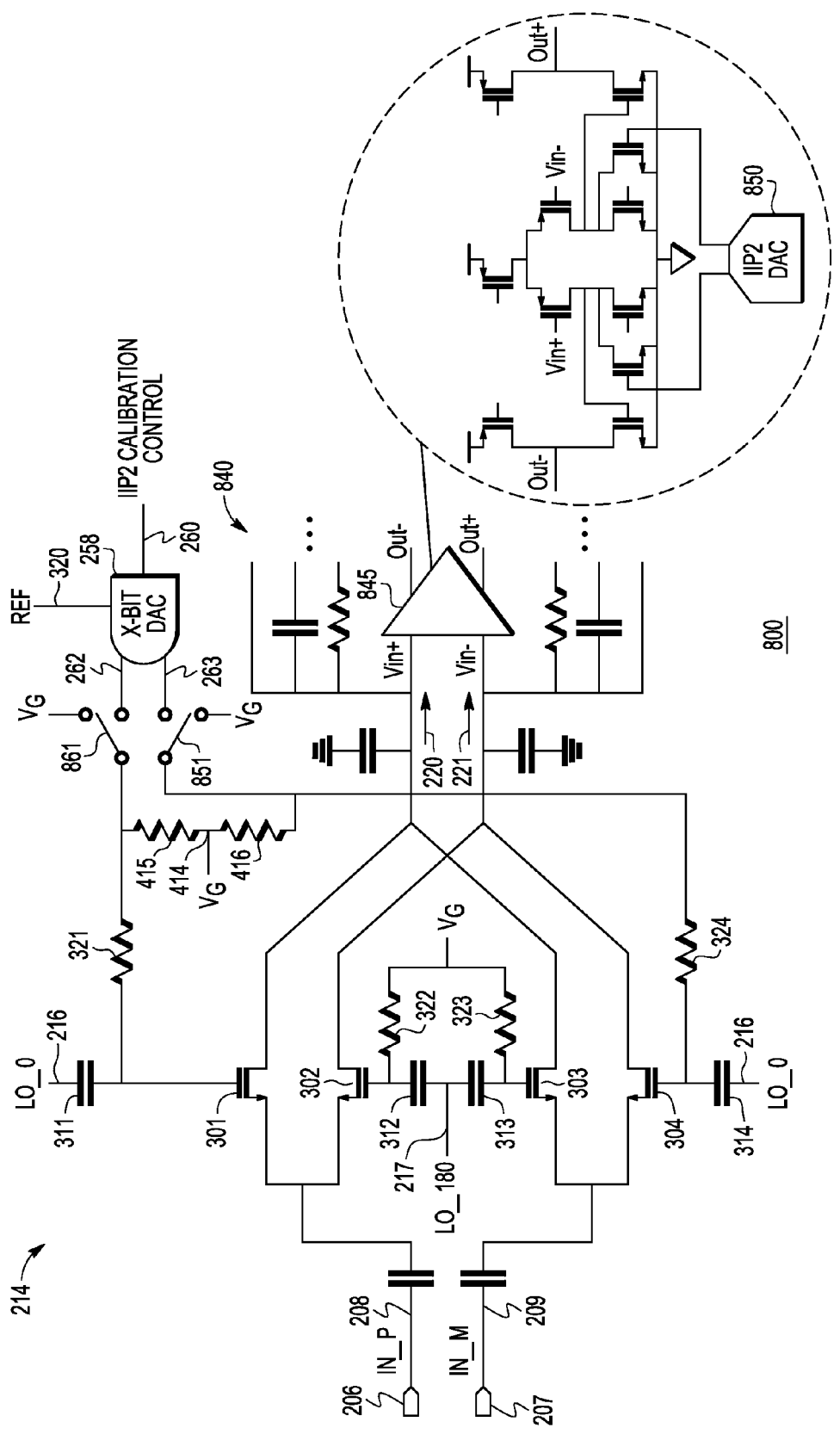
FIG. 8 is a schematic for a circuit of a sixth embodiment of the mixers of FIG. 2.

FIG. 8 is a schematic for a circuit 800 of a sixth embodiment of the mixer 214. The circuit 800 comprises a passive double balanced mixer and an active, lowpass filter 845. The differential outputs DAC_P and DAC_M are introduced to the mixer of FIG. 8 in a manner similar to how it is introduced in circuit 400. Alternatively, the IIP2 correction voltages are introduced to the mixer of FIG. 8 in a manner similar to how they are introduced in one of circuits 500, 600 and 700. Because the outputs 220 and 221 from the mixer 214 are currents, the mixer is directly coupled to the lowpass filter 840 without a resistor. The lowpass filter 840 includes an operational amplifier (OPAMP) 845. The OPAMP 845 includes an IIP2 calibration DAC 850 for performing fine IIP2 adjustment. Circuit 800 is a dual calibration approach with fine adjustment performed in the OPAMP 845. Because the majority of the offset is corrected at the mixer 214, the remaining fine offset is advantageously away from the DAC extremes of the range of DAC settings. In one method, used in conjunction with circuit 800, the IIP2 calibration DAC 850 in the OPAMP 845 performs further IIP2 calibration, and, because the remaining fine offset is away from the DAC extremes, the IIP2 calibration DAC 850 in the OPAMP 845 is able to successfully remove any remaining offset.

The circuit 800 includes switches 851 and 861 at the output of the IP2 control DAC 258 to switch out the IP2 control DAC 258 and to switch in the common-mode voltage to the gates of the devices 301 and 304. If the DAC settings needed to correct differential offsets due to the presence of interferers are not expected to be near the extremes of the range of DAC settings, the IIP2 calibration DAC 850 of the OPAMP 845 is turned on and the IP2 control DAC 258 is turned off.

In another method, used in conjunction with circuit 800, the DSP 250 determines a strength of any interferer signal received by the baseband receiver 202. If the strength of the interferer signal is above a predetermined threshold, the mixer 214 and 215 provides IIP2 correction, and outputs a baseband signal to the baseband circuits 226 of the receiver 202. In such case, the baseband circuits 226 do not attempt to correct the baseband signal for any differential mismatch. On the other hand, if the strength of the interferer signal is below a predetermined threshold, the mixer 214 and 215 performs down conversion without any attempt to also provide IIP2 correction, and outputs a baseband signal to baseband circuits 226. In such case, the baseband circuits 226 provide IIP2 correction for any differential mismatch.

The receiver 202 enables repeatable, high IIP2 performance over process and with enhancements over temperature. The receiver 202 provides a new way to calibrate IIP2 in a passive double balance mixer, where the correction is done at the gates of the devices of the mixer 214 and 215. The receiver 202 provides a new apparatus for minimizing IIP2 variation over temperature where the temperature-compensated source is used for all inputs to the mixer 214 and 215, and the output from the IP2 control DAC 258 and 259 is connected to the circuits 300, 400, 500, 600, 700 and 800 in several novel ways to improve IIP2 performance.

The IIP2 voltage offset correction, DAC_P and DAC_M, are introduced at the gates of the devices of the passive double balanced mixer 214 and 215. This produces very small DC offsets (3.5 mV), does not degrade noise because the resistor 321 and 324 are not in series with the gate of devices 301 and 304, does not degrade post-mixer CMRR and overcomes IIP2 calibration limitations.

The IP2 control DAC 258 and 259 generates a differential signal, DAC_P and DAC_M, with programmable offset for IIP2 calibration. The differential DAC signals, DAC_P and DAC_M, are connected to the gates of selective devices of the mixer 214 and 215, which are separated from DC with blocking capacitors.

In exemplary embodiments, the mixer 214 is used with a high-linearity, current-input baseband receiver 202 (virtual ground, low impedance, and crossover minimization). Calibration time is minimized using the circuits 300, 400, 500, 600, 700 and 800 compared to known circuits. Because induced DC offsets are negligible, calibration time is minimized.

Advantageously, no DCOC update is needed after the IIP2 DAC code update. This also minimizes complexity of the DCOC circuitry and minimizes noise.

Compensation at the gates allows the devices 301, 302, 303 and 304 to share a same bulk, which permits the devices to be laid out in a common centroid configuration for best matching of the mixer devices.

In multi-band receivers 202, calibration values of the IP2 control DAC 258 and 259 are stored for separate offsets because IIP2 can vary with interferer offset.

The circuits 300, 400, 500, 600, 700 and 800 can be used with the system, method and device described in U.S. patent application publication No. US2009/0186587 A1, filed Jan. 23, 2008, by Sobchak et al., entitled TUNING A SECOND ORDER INTERCEPT POINT OF A MIXER IN A RECEIVER.

It should be understood that all circuitry described herein may be implemented either in silicon or another semiconductor material or alternatively by software code representation of silicon or another semiconductor material.

Although the invention is described herein with reference to specific embodiments, various modifications and changes can be made without departing from the scope of the present invention as set forth in the claims below. For instance, although the exemplary embodiments show that the invention is used with a direct-conversion receiver, the invention is also usable in any receiver. Although the exemplary embodiments show that the invention is used to tune the second order intercept point (IP2) to reduce second order intermodulation distortion (IMD2), the invention also applies to any higher order intercept point (IPn) and a corresponding higher order intermodulation distortion product (IMDn), where n is an even integer greater than two. In exemplary embodiments, the receiver 202 is disposed on an integrated circuit fabricated using CMOS technology; however, the invention can also be used on an integrated circuit fabricated using other technologies. For example, if the devices of the mixer 214 and 215 were bipolar junction transistors, the bias of the base would be changed instead of the bias of the gate.

Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit for calibrating a second order intercept point of a mixer, comprising:
    an oscillator circuit for providing a local oscillator signal (LO_0) and a complementary local oscillator signal (LO_180);
    a mixer having IN_P and IN_M input nodes for receiving differential input signals, and output nodes for outputting differential output currents, the mixer further comprising two balanced differential pairs, in which:
        a first balanced differential pair comprises first and second devices having sources coupled to the IN_P input node and drains coupled to opposite output nodes, the first device having a gate for receiving the LO_0 signal, the second device having a gate for receiving the LO_180 signal, the gate of the second device coupled to an uncompensated common-mode voltage source, and
        a second balanced differential pair comprises third and fourth devices having sources coupled to the IN_M input node and drains coupled to opposite output nodes, the third device having a gate for receiving the LO_180 signal, the gate of the third device coupled to the uncompensated common-mode voltage source, the fourth device having a gate for receiving the LO_0 signal;
    a digital signal processor, which receives output signals from the mixer, for generating an IIP2 calibration digital control word indicative of an optimal IIP2 setting for the mixer to compensate for imbalance in the differential output currents, thereby calibrating a value of the second order intercept point of the mixer to a maximum value; and
    a single digital-to-analog converter, coupled to the digital signal processor, for converting the calibration digital control word to an IIP2 correction voltage and having one output terminal, coupled to the gate of the first device, for outputting a DAC_P differential correction signal that consists of a common-mode voltage plus the IIP2 correction voltage, and having another output terminal, coupled to the gate of the fourth device, for outputting a DAC_M differential correction signal that consists of the common-mode voltage minus the IIP2 correction voltage.

2. The circuit of claim 1, including a temperature-compensated voltage source that provides a voltage reference to the single digital-to-analog converter and provides the uncompensated common-mode voltage.

3. The circuit of claim 1, including a temperature-compensated voltage source that provides a voltage reference to the single digital-to-analog converter, and including a center-tapped pair of resistors across output terminals of the single digital-to-analog converter for providing, at the center-tap, the uncompensated common-mode voltage.

4. The circuit of claim 1, in which the mixer is a passive mixer.

5. The circuit of claim 1, in which the mixer is disposed on an integrated circuit in a common-centroid layout.

6. A circuit for calibrating a second order intercept point of a mixer, comprising:
    an oscillator circuit for providing a local oscillator signal (LO_0) and a complementary local oscillator signal (LO_180);
    a mixer having IN_P and IN_M input nodes for receiving differential input signals, and output nodes for outputting differential output currents, the mixer further comprising two balanced differential pairs, in which:

a first balanced differential pair comprises first and second devices having sources coupled to the IN_P input node and drains coupled to opposite output nodes, the first device having a gate for receiving the LO_0 signal, the second device having a gate for receiving the LO_180 signal, the gate of the second device coupled to an uncompensated common-mode voltage source, and a second balanced differential pair comprises third and fourth devices having sources coupled to the IN_M input node and drains coupled to opposite output nodes, the third device having a gate for receiving the LO_180 signal, the gate of the third device coupled to the uncompensated common-mode voltage source, the fourth device having a gate for receiving the LO_0 signal;

a digital-to-analog converter having a DAC_P output terminal for outputting a DAC_P differential correction signal and a DAC_M output terminal for outputting a DAC_M differential correction signal;

a first switch having one terminal coupled to the gate of the first device, and another terminal coupled to one of the uncompensated common-mode voltage source and the DAC_P output terminal of the digital-to-analog converter;

a second switch having one terminal coupled to the gate of the fourth device, and another terminal coupled to one of the uncompensated common-mode voltage source and the DAC_M output terminal of the digital-to-analog converter; and a digital signal processor, coupled to the digital-to-analog converter and to the mixer, for controlling values of the DAC_P and DAC_M differential correction signals to compensate for imbalance in the differential output currents, thereby calibrating a value of the second order intercept point of the mixer to a maximum value.

7. The circuit of claim 6, in which the digital signal processor controls the first switch and the second switch, thereby causing one of inclusion or exclusion of the digital-to-analog converter in the circuit.

8. The circuit of claim 6, including a temperature-compensated voltage source that provides a voltage reference to the digital-to-analog converter.

9. The circuit of claim 8, including a pair of resistors connected in series across the output terminals of the digital-to-analog converter, a node between the pair of resistors being coupled to the gate of the second device and to the gate of the third device, a voltage at the node providing the uncompensated common-mode voltage source.

10. The circuit of claim 6, including a temperature-compensated voltage source that provides a voltage reference to the digital-to-analog converter and provides the uncompensated common-mode voltage.

11. The circuit of claim 6, in which the mixer is a passive mixer.

12. The circuit of claim 6, in which the mixer is disposed on an integrated circuit in a common-centroid layout.

13. A circuit for calibrating a second order intercept point of a mixer, comprising:

an oscillator circuit for providing a local oscillator signal (LO_0) and a complementary local oscillator signal (LO_180);

a mixer having IN_P and IN_M input nodes for receiving differential input signals, and output nodes for outputting differential output currents, the mixer further comprising two balanced differential pairs, in which:

a first balanced differential pair comprises first and second devices having sources coupled to the IN_P input node and drains coupled to opposite output nodes, the first device having a gate for receiving the LO_0 signal, the second device having a gate for receiving the LO_180 signal, the gate of the second device coupled to an uncompensated common-mode voltage source, and a second balanced differential pair comprises third and fourth devices having sources coupled to the IN_M input node and drains coupled to opposite output nodes, the third device having a gate for receiving the LO_180 signal, the gate of the third device coupled to the uncompensated common-mode voltage source, the fourth device having a gate for receiving the LO_0 signal;

a digital-to-analog converter having one output terminal coupled to the gate of the first device, for outputting a DAC_P differential correction signal and having another output terminal, coupled to the gate of the fourth device, for outputting a DAC_M differential correction signal;

a digital signal processor, coupled to the mixer and to an input terminal of the digital-to-analog converter, for controlling values of the DAC_P and DAC_M differential correction signals to compensate for imbalance in the differential output currents, thereby calibrating a value of the second order intercept point of the mixer to a maximum value; and a lowpass filter coupled to the output nodes of the mixer, the lowpass filter including an operational amplifier that includes an IIP2 calibration digital-to-analog converter, the operational amplifier having differential output terminals for outputting mixer signals calibrated for the second order intercept point, in which a majority of differential mismatch is corrected at the mixer and any remaining differential mismatch at the output nodes of the mixer is corrected by the operational amplifier.

14. The circuit of claim 13, in which the digital signal processor controls turning off and on of the IIP2 calibration digital-to-analog converter of the lowpass filter.

15. The circuit of claim 13, including a temperature-compensated voltage source that provides a voltage reference to the digital-to-analog converter.

16. The circuit of claim 15, including a pair of resistors connected in series across the output terminals of the digital-to-analog converter, a node between the pair of resistors being coupled to the gate of the second device and to the gate of the third device, a voltage at the node providing the uncompensated common-mode voltage source.

17. The circuit of claim 13, including a temperature-compensated voltage source that provides a voltage reference to the digital-to-analog converter and provides the uncompensated common-mode voltage.

18. The circuit of claim 13, in which the mixer is a passive mixer.

19. The circuit of claim 13, in which the mixer is disposed on an integrated circuit in a common-centroid layout.

* * * * *